United States Patent
Miller

(10) Patent No.: US 6,287,974 B1
(45) Date of Patent: Sep. 11, 2001

(54) METHOD OF ACHIEVING TOP ROUNDING AND UNIFORM ETCH DEPTHS WHILE ETCHING SHALLOW TRENCH ISOLATION FEATURES

(75) Inventor: Alan J. Miller, Moraga, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/346,563

(22) Filed: Jun. 30, 1999

(51) Int. Cl.[7] .................... H01L 21/302; H01L 21/3065; H01L 21/308
(52) U.S. Cl. .................. 438/706; 760/712; 760/723; 760/724
(58) Field of Search ..................... 438/700, 706, 438/712, 723, 724, 710

(56) References Cited

U.S. PATENT DOCUMENTS

| | | | |
|---|---|---|---|
| 4,729,815 | * 3/1988 | Leung | 438/714 |
| 5,013,689 | 5/1991 | Yamamoto et al. | 438/702 |
| 5,458,734 | 10/1995 | Tsukamoto | 438/701 |
| 5,753,561 | 5/1998 | Lee et al. | . |
| 5,801,083 | 9/1998 | Yu et al. | 438/424 |
| 5,807,789 | 9/1998 | Chen et al. | 438/714 |
| 5,817,567 | 10/1998 | Jang et al. | 438/427 |
| 5,843,226 | * 12/1998 | Zhao et al. | 117/97 |
| 5,843,846 | * 12/1998 | Nguyen et al. | 438/713 |
| 5,858,857 | 1/1999 | Ho | 438/42 |
| 5,880,004 | 3/1999 | Ho | 438/421 |
| 5,882,982 | 3/1999 | Zheng et al. | 438/424 |
| 5,939,765 | * 8/1999 | Zheng et al. | 257/510 |
| 5,994,229 | 11/1999 | Chen et al. | 438/700 |

OTHER PUBLICATIONS

Goss et al., "The Challenges of Nitride Spacer Processing for a 0.35μm CMOS Technology", Sep. 10–12, 1997, IEEE/SEMI Advanced Semiconductor Manufacturing Conference.

* cited by examiner

Primary Examiner—Benjamin L. Utech
Assistant Examiner—Lynette T. Umez-Eronini
(74) Attorney, Agent, or Firm—Beyer Weaver & Thomas, LLP

(57) ABSTRACT

A method of etching a trench in a silicon layer is disclosed. The silicon layer being disposed below an oxide layer. The oxide layer being disposed below a nitride layer. The nitride layer being disposed below a photoresist mask. The etching taking place in a plasma processing chamber. The method includes flowing a first etchant source gas into the plasma processing chamber, forming a first plasma from the first etchant source gas and etching substantially through the nitride layer with the first plasma. The method further includes flowing a second etchant source gas into the plasma processing chamber, forming a second plasma from the second etchant source gas and etching through the oxide layer and a portion of the silicon layer with the second plasma wherein the etching with the second plasma is extended for a period of time after the pad oxide layer is etched through. The period of time being sufficiently long to form an effective top-rounded feature on a portion of the trench.

28 Claims, 4 Drawing Sheets

US 6,287,974 B1

METHOD OF ACHIEVING TOP ROUNDING AND UNIFORM ETCH DEPTHS WHILE ETCHING SHALLOW TRENCH ISOLATION FEATURES

BACKGROUND OF THE INVENTION

The present invention relates to the fabrication of semiconductor integrated circuits (IC's). More particularly, the present invention relates to methods and apparatuses for etching through an IC's layer stack to produce a top rounded isolation feature.

During the manufacture of a semiconductor-based product, for example, a flat panel display or an integrated circuit, multiple deposition and/or etching steps may be employed. By way of example, one method of etching is plasma etching. In plasma etching, a plasma is formed from the ionization and dissociation of process gases. The positively charged ions are accelerated towards the substrate where they, in combination with neutral species, drive the etching reactions. In this manner, etched features such as vias, contacts, or trenches may be formed in the layers of the substrate.

Recently, shallow trench isolation (STI) has grown in popularity as a preferred method for forming a trench that can, among other applications, electrically isolate individual transistors in an integrated circuit. Electrical isolation is needed to prevent current leakage between two adjacent devices (e.g., transistors). Broadly speaking, conventional methods of producing a shallow trench isolation feature include: forming a hard mask over the targeted trench layer, patterning a soft mask over the hard mask, etching the hard mask through the soft mask to form a patterned hard mask, and thereafter etching the targeted trench layer to form the shallow trench feature. Subsequently, the soft mask is removed (e.g., stripped) and the shallow trench isolation feature is back-filled with a dielectric material.

FIGS. 1A–1C are cross section views of the conventional process steps that maybe used to form shallow trench isolation features. Referring initially to FIG. 1A, there is shown a typical layer stack 10 that is part of a substrate or semiconductor wafer. (not drawn to scale for ease of illustration). A silicon layer 12 is located at the bottom of layer stack 10. A pad oxide layer 14 is formed above silicon layer 12 and a nitride layer 16 is formed above pad oxide layer 14. In most situations, the pad oxide layer is used as the interlayer that is disposed between the nitride layer and the silicon layer. Furthermore, in order to create a patterned hard mask with pad oxide layer 14 and nitride layer 16, a photoresist layer 18 is deposited and patterned using a conventional photolithography step over nitride layer 16. After patterning, soft mask openings 20 (narrow) and 22 (wide) are created in photoresist layer 18 to facilitate subsequent etching. The above-described layers and features, as well as the processes involved in their creation, are well known to those skilled in the art.

Following the formation of layer stack 10, nitride layer 16 and pad oxide 14 are subsequently etched to create a hard mask, which includes a narrow hard mask opening 24 and a wide hard mask opening 26, as seen in FIG 1B. The hard mask openings are used to pattern the trench during etching of the silicon layer. For the most part, etching stops after reaching silicon layer 12, however, a small portion 28 on the surface of silicon layer 12 is typically etched away during the etching of pad oxide layer 14. Moreover, a gas chemistry that includes CF4 is generally used to facilitate etching through the nitride and pad oxide layers. Typically, the CF4 chemistry etches the side walls of nitride layer 16, pad oxide layer 14 and small portion 28 of silicon layer 12 anisotropically (i.e., substantially straight down).

Once hard mask openings are created through nitride layer 16 and pad oxide layer 14, silicon layer 12 is etched therethrough to form shallow trench isolation features, for example, a narrow feature 30 and a wide feature 32, as shown in FIG. 1C.

Typically, a gas chemistry that includes $Cl_2$ and/or HBr is used to facilitate etching through the silicon layer. Subsequent to the steps shown in FIGS. 1B&1C, the mask layers are removed, leaving a trench disposed in the silicon layer. Typically, thereafter, the trenches are filled with a dielectric material such as an oxide (e.g., TEOS) to complete the formation of the shallow trench isolation.

Typically, the shallow trench isolation features, etched in silicon, produce a harp corner 34 in the vicinity of the interface of pad oxide layer 14 and silicon layer 12. If there is a sharp corner at the top of the feature when a dielectric material is deposited into the feature, the dielectric material may wrap around the corner creating a layer with varying thickness. Typically, the dielectric material (e.g., oxide) is the thinnest at the sharp corner. In some cases, the thin region at the sharp corner may cause a gate leakage problem. Adversely, gate leakage tends to cause malfunctions in the semiconductor device (e.g., threshold voltage problems).

Additionally, in shallow trench isolation, the etch results tend to differ based on the geometry of the feature (e.g., narrow spaces and wide spaces). Typically, wide trenches have an increased etch rate over narrow trench etch rates. Correspondingly, differing etch rates tend to create a depth difference between the features. Referring to FIG. 1C, a depth difference 36 is shown between narrow feature 30 and wide feature 32. Trenches of varying depths may have adverse impacts on the functioning of the device. By way of example, if a depth non-uniformity exists between two features during subsequent deposition steps (e.g., filling the feature with dielectric), a non-level top surface may be encountered (i.e., more dielectric in one area and less dielectric in another area). Significant yield problems may be encountered when the top surface of the substrate is not flat or level. For this reason, it is desirable to create trenches that have substantially similar depths. Preferably, for a smooth functioning device, the depth difference is between 2 to 5% or even lower. However, the semiconductor industry often sees more than a 12.5% difference between the depths of the narrow features and the wide features.

In view of the foregoing, there are desired improved techniques for etching features having rounded corners, substantially equal depths and similar profiles. Also, desired are etch techniques that may be implemented "in situ," in other words, in one plasma processing chamber. Historically, trench features have been etched with a sequential process flow, where the mask layers are etched in one chamber and the silicon trench is etched in another chamber. A significant improvement in productivity can be achieved if the mask and trench etch is performed in situ (in the same chamber).

SUMMARY OF THE INVENTION

The invention relates, in one embodiment, to a method of etching a trench in a silicon layer. The silicon layer being disposed below an oxide layer. The oxide layer being disposed below a nitride layer. The nitride layer being disposed below a photoresist mask. The etching taking place in a plasma processing chamber. The method includes flowing a first etchant source gas into the plasma processing chamber, forming a first plasma from the first etchant source gas and etching substantially through the nitride layer with the first plasma. The method further includes flowing a second etchant source gas into the plasma processing chamber, forming a second plasma from the second etchant source gas and etching through the oxide layer and a portion of the silicon layer with the second plasma wherein the etching with the second plasma is extended for a period of time after the pad oxide layer is etched through. The period of time being sufficiently long to form an effective top-rounded feature on a portion of the trench.

The invention relates, in another embodiment, to a method of etching a trench in an underlying layer. The underlying layer being disposed underneath a hard mask layer. The etching taking place in a plasma processing chamber. The method includes flowing a hard mask etchant source gas into the plasma processing chamber. The method further includes forming a plasma from the hard mask etchant source gas. The plasma being substantially selective to the underlying layer. The method additionally includes etching through the hard mask layer and a portion of the underlying layer with the plasma, wherein the etching is extended for a period of time after the hard mask layer is etched through. The period of time being sufficiently long to form an effective top-rounded attribute at a shoulder of the underlying layer.

The invention relates, in another embodiment, to a method of etching a trench in a silicon layer. The silicon layer being disposed underneath an oxide layer. The etching taking place in a plasma processing chamber. The method includes flowing an etchant source gas into the plasma processing chamber. The method further includes forming a plasma from the etchant source gas. The plasma being substantially selective to silicon. The method additionally includes etching through the oxide layer and a portion of the silicon layer with the plasma, wherein the etching is extended for a period of time after the hard mask layer is etched through. The period of time being sufficiently long to form an effective top-rounded attribute at a shoulder of the underlying layer.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF PREFERRED EMBODIMENTS

Figure 1A:
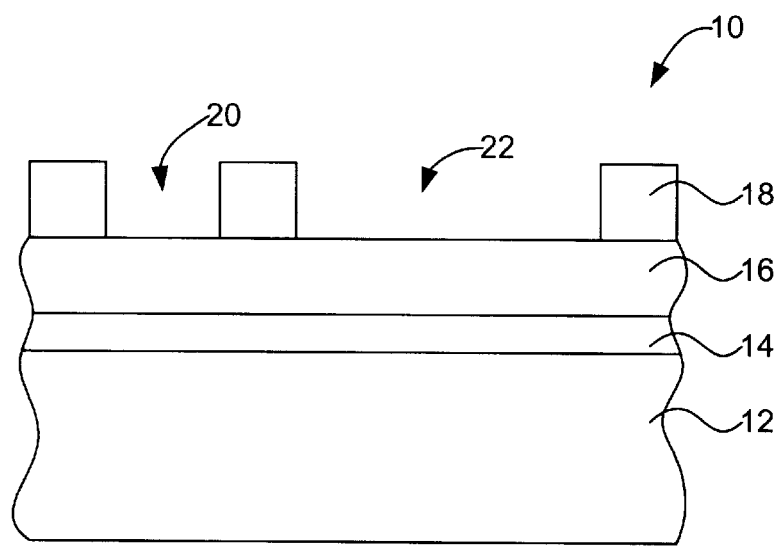
FIG. 1A illustrates a cross-sectional view of a layer stack, representing some of the layers formed during the fabrication of a shallow trench isolation.
Figure 1B:
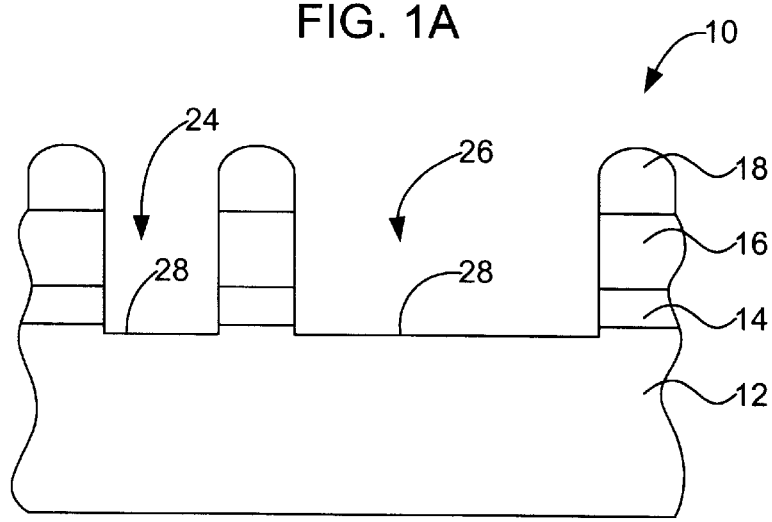
FIG. 1B shows the same layer stack of FIG. 1A after a hard mask has been etched through the nitride and pad oxide layers.
Figure 1C:
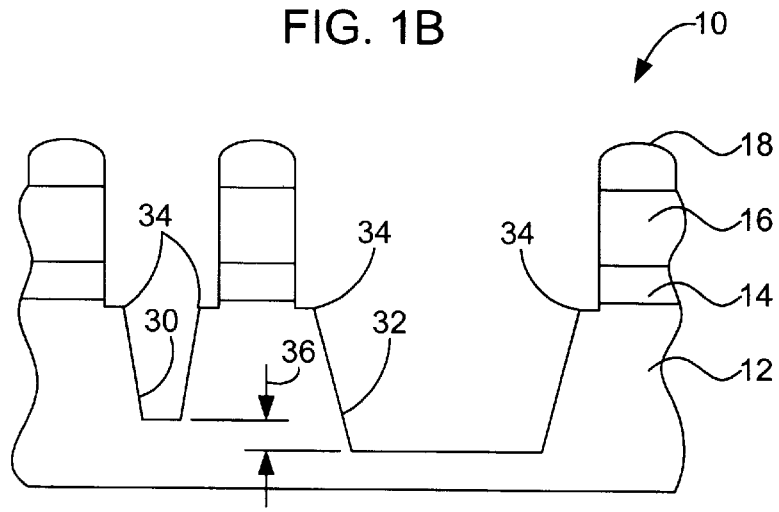
FIG. 1C depicts the same layer stack of FIG. 1A after a shallow trench isolation feature has been etched through the silicon layer.

The present invention will now be described in detail with reference to a few preferred embodiments thereof and as illustrated in the accompanying drawings. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

There are certain key attributes of the shallow trench isolation etch that are required to make sure that the device will perform properly. By way of example, for shallow trench isolation features etched into silicon, it is necessary to provide a rounded corner at the top of the trench, to prevent current leakage in the semiconductor device. Typically, a rounded corner produces a smooth contour that enables subsequent layer deposition steps to have an even thickness around the corner. A corner with more radius is less likely to wrap around and therefore tends to reduce gate leakage problems. As the term is employed herein, an effective top rounded feature is a top rounded feature that is sufficiently contoured, i.e. lacking sharp corners, to substantially eliminate gate leakage problems.

In accordance with one aspect of the present invention, top-rounded features in shallow trench isolation are achieved "in situ" by etching a nitride layer (e.g., $Si_xN_y$) with a first etchant source gas chemistry and etching a pad oxide layer with a second etchant source chemistry that is substantially selective to silicon in a single plasma processing chamber. The etchings preferably take place while the substrate is disposed on a chuck within a single plasma processing chamber. Typically, the first etchant source gas is flowed into the chamber, and the pressure is stabilized. After the pressure has been stabilized the plasma is ignited, thereby generating ions from the etchant source gas. Next the plasma is stabilized and the ions are accelerated towards the substrate where they assist in etching the nitride layer, substantially stopping on the pad oxide layer or shortly after reaching the nitride/pad oxide interface. As mentioned, the etched nitride layer may be patterned with a photoresist mask or another suitable mask.

The first etchant source gas is then evacuated from the chamber and the second etchant source gas is flowed into the chamber. Preferably, a chemistry having a relatively high selectivity to silicon is used. Preferably, the chemistry has a pad oxide:silicon selectivity at least about 1.2:1, more preferably at least 2:1, and preferably at least 3:1. After the pressure has been stabilized, the plasma is ignited, thereby generating ions from the second etchant source gas. The ions are accelerated towards the substrate where they assist in etching the pad oxide layer.

Advantageously, as the pad oxide is etched through, the oxide etch process starts to round the corner of the silicon at the pad oxide/silicon interface. That is, the top rounding in silicon occurs as the oxide etch process reaches the pad oxide/silicon interface. While not wishing to be bound by theory, it is believed that the top rounding occurs because of the high silicon selectivity in the etchant source gas employed in the oxide etch step and due to the build up of polymer along the side walls of the hard mask and above the silicon. In other words, as the oxide etchants etch away the silicon slowly, a passivating film is built up along the vertical side walls. Because the slow downward etch (due to the high silicon selectivity of the oxide etchant) through silicon is accompanied by simultaneous lateral growth of the passivating film, the silicon etch profile near the pad oxide/ silicon interface has both a vertical downward component and a lateral sideway component as the etch progresses. Accordingly, the shoulder that is formed thereby is a gradual slope instead of an abrupt drop off, i.e., a top rounded feature.

Moreover, the passivating film that forms a protective mask along the side walls of the nitride and pad oxide layer sits above the top rounded feature in the silicon layer, so that during subsequent steps, the top rounding is preserved. If the passivating film were not covering the top rounding during the silicon trench etch, the silicon trench etch would have etched straight through the top rounding, leaving a sharp corner at the pad oxide/silicon interface without top rounding.

Furthermore, when the pad oxide etchant encounters the silicon interface, the etch rate slows down (e.g., due to the high silicon selectivity) such that the wide features do not etch deeper into the silicon than the narrow features. That is, the amount (e.g., depth) of silicon removed during the pad oxide etch is substantially the same between the narrow and wide features. In this manner, the depth difference is substantially reduced and depth uniformity between feature sizes is substantially maintained during the subsequent silicon etch. By the time the silicon etch is completed, the depth among the features are more closely balanced. Effectively balanced etch depths in narrow and wide regions in the silicon layer means that the etch depths are balanced enough to substantially eliminate silicon etch-depth related yield problems.

In accordance with one important aspect of the present invention, the pad oxide etch is allowed to prolong for a sufficient amount of time to allow the top rounded feature to form and/or to substantially balance the etch depths between the narrow and wide areas after the pad oxide layer is etched through.

Subsequent to the etching of the hard mask opening through the nitride and pad oxide layers, which forms the top rounding of the silicon features and the a protecting passivation layer, the second etchant source gas is evacuated from the chamber and a third etchant source gas, which is configured to etch the silicon layer is flowed into the chamber. After the pressure has been stabilized the plasma is ignited, thereby generating ions from the third etchant source gas. The ions are accelerated towards the substrate where they assist in etching the silicon layer thereby forming the shallow trench isolation feature. As mentioned, the passivation layer advantageously protects the top rounding at the silicon/pad oxide interface.

In one embodiment, a first etchant source chemistry that includes a fluorocarbon (e.g., $CF_4$, $C_2F_6$ and/or $CHF_3$) is preferably employed to etch features through a nitride layer down to an underlying pad oxide layer. Furthermore, a second etchant source chemistry that includes a hydro-fluorocarbon (e.g., $CHF_3$, $CH_2F_2$, $CH_3F, CH_4$, $C_4F_8$, $C_2F_6$, $C_2HF_5$) is preferably employed to etch features through the pad oxide layer down to an underlying silicon layer. Preferably, the hydro-fluorocarbon etchant source chemistry has a high selectivity with respect to the underlying silicon layer. A third etchant source chemistry that includes a chlorine (e.g., $Cl_2$) and/or bromine (e.g., HBr) is employed to etch through the silicon layer to form a shallow trench isolation feature.

Figure 2:
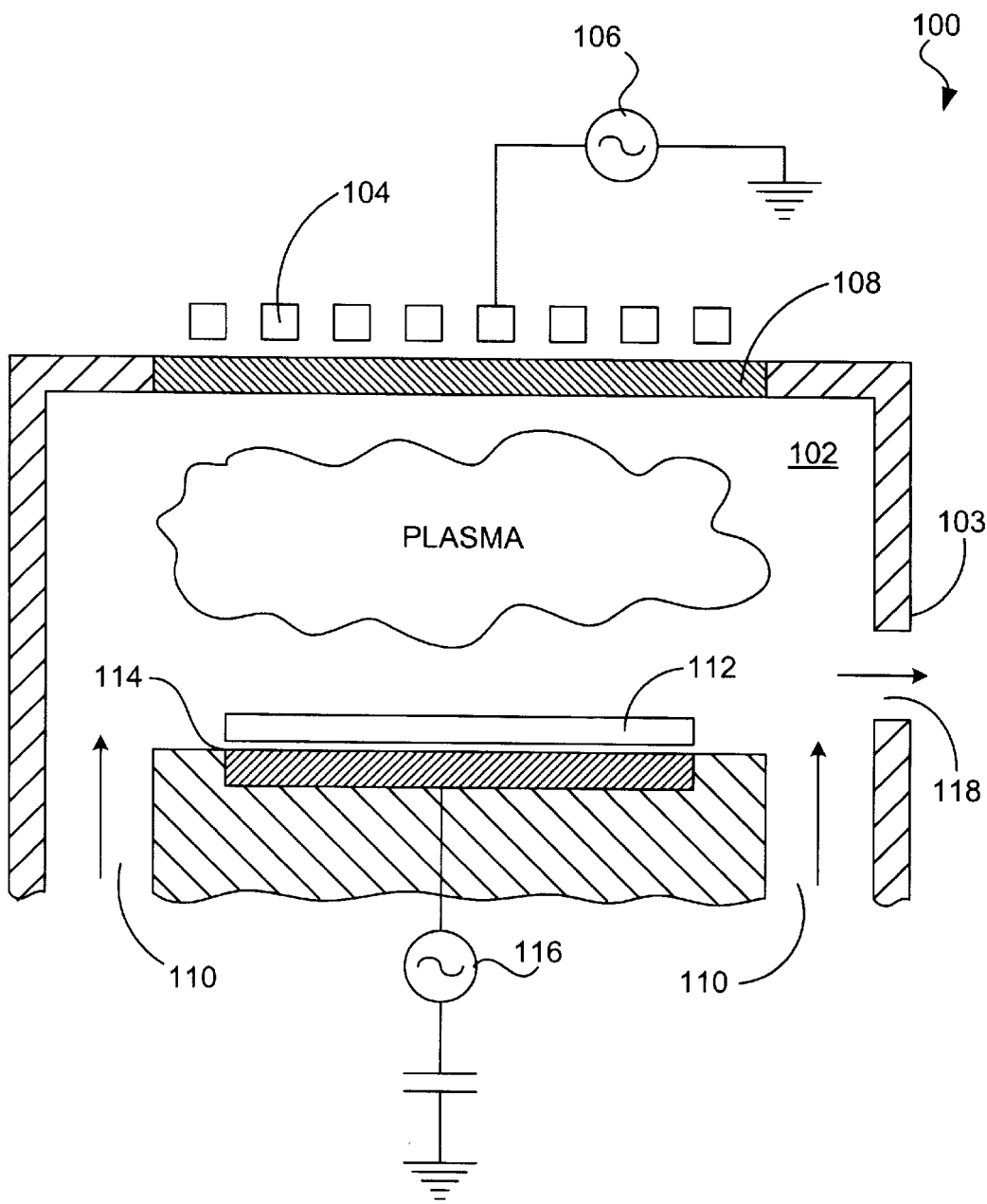
FIG. 2 is a simplified schematic diagram of a plasma reactor that may be suitably employed with the inventive etch process, according to one embodiment of the present invention.

In a preferred embodiment, the present invention is practiced in a high density plasma reactor, such as the inductively coupled TCPT™ 9400 plasma reactor, which is available from Lam Research Corporation of Fremont, Calif. FIG. 2 illustrates a simplified schematic of the TCPT™ 9400 plasma reactor. Plasma reactor 100 includes a plasma processing chamber 102 with a chamber wall 103. Chamber wall 103 is preferably made from anodized aluminum. To provide an electrical path to ground, the chamber wall of chamber 102 is typically grounded. Above chamber 102, there is disposed an inductive electrode 104 (represented by a coil). Inductive electrode 104 is powered by a first RF power source 106 via a matching network (not shown in FIG. 2 to simplify the illustration). Preferably, a dielectric window 108 is disposed below inductive electrode 104.

Typically, a gas port 110 is provided within chamber 102. Gas port 110 is preferably disposed around the inner periphery of chamber 102 and is arranged for releasing gaseous source materials, e.g., the etchant source gases, into the RF-induced plasma region between dielectric window 108 and a substrate 112. Alternatively, the gaseous source materials may also be released from ports built into the walls of the chamber itself or through a shower head arranged in the dielectric window. Substrate 112 is introduced into chamber 102 and disposed on a chuck 114, which acts as a bottom electrode and is preferably biased by a second RF power source 116 (also typically via a matching network). Chuck 114 may optionally include a focus ring (not shown to simplify illustration), preferably made from silicon oxide or aluminum oxide ceramic, positioned around the bottom electrode. Chuck 114 may represent, for example, an ESC (electrostatic) chuck, which secures substrate 112 to the chuck's surface by electrostatic force.

Still referring to FIG. 2, an exhaust port 118 is typically disposed on one side of chamber 102. Exhaust port 116 is coupled to a turbomolecular pump (not shown), typically located outside of chamber 102. For the most part, the turbomolecular pump maintains the appropriate pressure inside chamber 102. Although, the high density, inductively coupled reactor is employed as the preferred apparatus for forming shallow trench isolation features and has shown particularly good results, any plasma reactor that is suitable for forming a plasma, such as a capacitively coupled reactor or wave excited reactor, e.g., ECR (microwave) or helicon resonator, may be used.

In accordance with one embodiment of the present invention, an inventive etch process employing a first etch chemistry that includes $CF_4$, a second etch chemistry that includes $CHF_3$ and/or $CH_2F_2$ and a third etch chemistry that includes $Cl_2$ is employed to achieve top-rounded features with good depth uniformity. Both $CHF_3$ and $CH_2F_2$ etch chemistries are fluorocarbon gases that provide a pad oxide to silicon selectivity of greater than about 2:1.

Figure 3A:
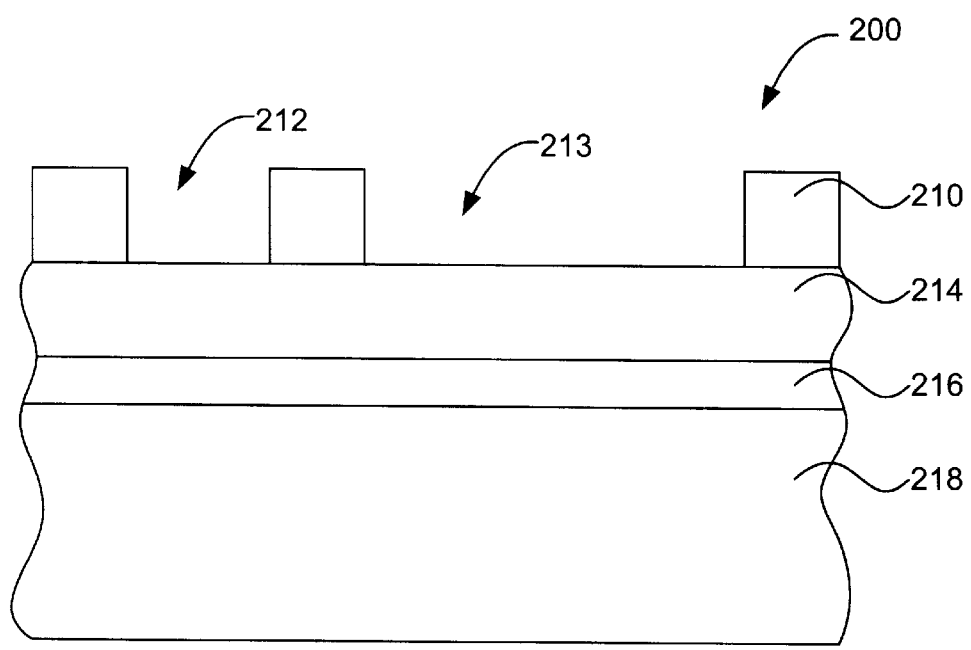
FIG. 3A illustrates a cross-sectional view of a layer stack, prior to being etched using the inventive etch process, according to one embodiment of the present invention.

FIG. 3A illustrates a typical layer stack 200 that may be etched with the inventive etch process to form a shallow trench isolation feature, in accordance with one embodiment of the present invention A photoresist mask 210 with a patterned narrow mask opening 212 and wide mask opening 213 is disposed above a nitride layer 214. Nitride layer 214 is disposed above a pad oxide layer 216. Typically, the nitride layer and the pad oxide layer form a hard mask for the silicon etch step. For the most part, the nitride and pad oxide layers are sacrificial layers that will be removed in subsequent processes and therefore the thickness of the nitride and pad oxide layers tend to vary. Furthermore, pad oxide layer 216 is disposed above a silicon layer 218 (monocrystalline or epitaxcal). Preferably, the silicon layer is used to form the shallow trench isolation features.

Figure 3B:
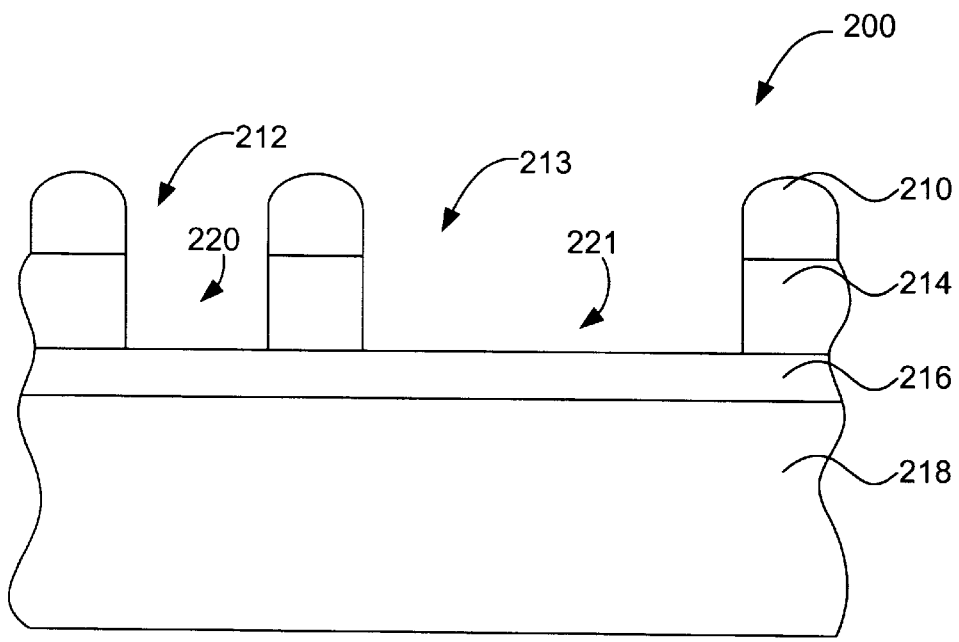
FIG. 3B shows the same layer stack of FIG. 3A after a hard mask has been etched through the nitride layer, according to one embodiment of the present invention.

FIG. 3B shows the layer stack 200 of FIG. 3A after nitride layer 214 is etched using a $CF_4$-based etchant source gas, in accordance with one embodiment of the present invention. Through the patterned narrow mask opening 212 and wide mask opening 213, etchants (formed by a plasma created with the $CF_4$-based etchant source gas) react with the material of nitride layer 214 to form an etched feature in nitride layer 214. During this etching process, the plasma tends to anisotropically etch a narrow nitride opening 220 and a wide nitride opening 221. The plasma also tends to erode away some of photoresist layer 210 from an initial thickness. Etching with the first etchant source gas is substantially stopped on pad oxide layer 216 or shortly thereafter, as shown.

Figure 3C:
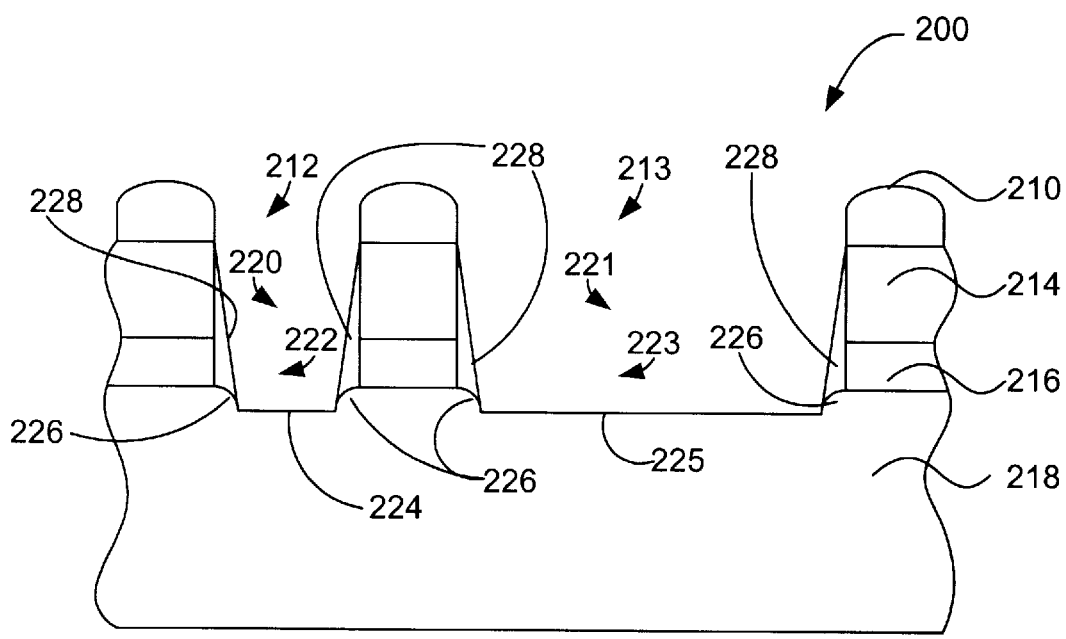
FIG. 3C shows the same layer stack of FIG. 3A after the pad oxide and a portion of the silicon layer have been etched using the inventive etch process that employs either the $CH_2F_2$ or $CHF_3$ etchant source gas, according to one embodiment of the present invention.

FIG. 3C shows the layer stack 200 of FIG. 3A after pad oxide layer 216 is etched using a $CH_2F_2$ and/or $CHF_3$-based etchant source gas, in accordance with one embodiment of the present invention. Through the patterned mask openings 212 and 213, and patterned nitride openings 220 and 221, etchants (formed by a plasma created with the $CH_2F_2$ or $CHF_3$-based etchant source gas) react with the material of the pad oxide layer 216 to form an etched feature in pad oxide layer 216. During this etching process, the plasma tends to anisotropically etch a narrow pad oxide opening 222 and a wide pad oxide opening 223. The plasma also tends to erode away some more of photoresist mask 210.

Further, a narrow top portion 224 and a wide top portion 225 of silicon layer 218 is etched during the etching of pad oxide layer 216. The etching of the silicon layer forms a top rounded attribute 226 at the shoulders of top portions 224 and 225, which starts at about the silicon layer/pad oxide layer interface, as shown. More specifically, the process etches through the pad oxide and begins to etch the silicon with a tapered profile (e.g., less than 80 degrees) profile, which forms the top rounded attribute.

By controlling the gas chemistry and reactor conditions, a passivating film 228 is deposited on the wall of the features (e.g., nitride, pad oxide and silicon), while the silicon etches. Typically, the passivation layer is formed from remnants of the pad oxide, silicon and photoresist layers. Preferably, the pad oxide etch is allowed to continue for an effective amount time after the pad oxide layer is etched through to allow the formation of an effective top rounded feature and/or to balance the etch depths in the silicon layer to a desired level. Advantageously, the passivating film is also deposited above the top rounded attribute. In this manner, passivating film 228 acts as a mask that protects top rounded attributes 226 during the subsequent silicon trench etch. The passivation layer may be subsequently stripped off (e.g., photoresist strip sequence).

Figure 3D:
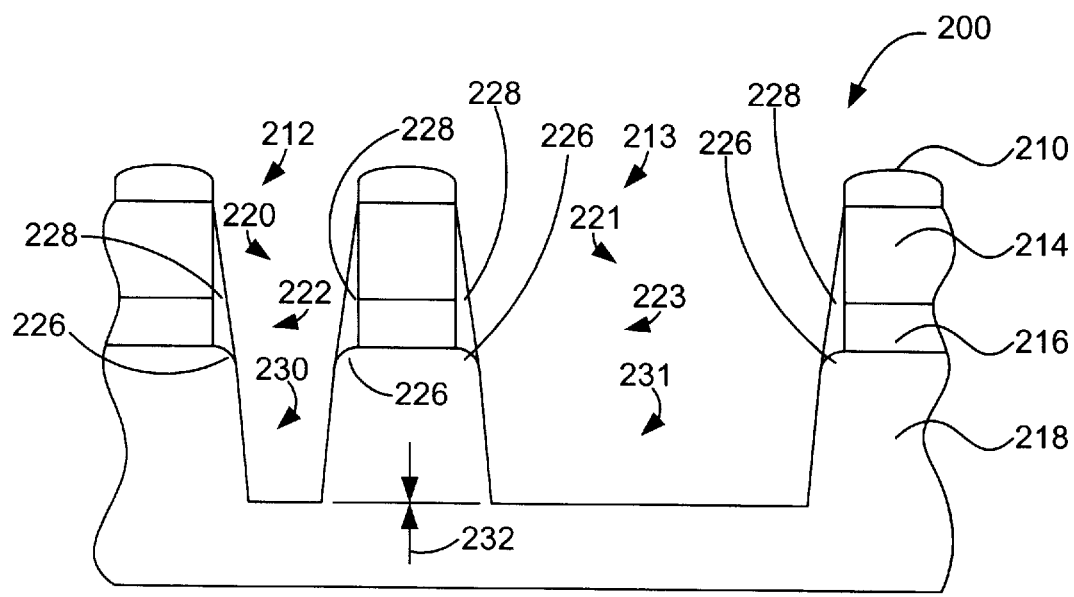
FIG. 3D shows the same layer stack of FIG. 3A after a shallow trench isolation feature has been etched through the silicon layer using the inventive etch process, according to one embodiment of the present invention.

FIG. 3D shows the layer stack 200 of FIG. 3A after silicon layer 218 is etched using a $Cl_2$-based etchant source gas, in accordance with one embodiment of the present invention. Through the patterned mask openings 212 and 213, the patterned nitride openings 220 and 221, and patterned pad oxide openings 222 and 223, etchants (formed by a plasma created with the $Cl_2$-based etchant source gas) react with the material of the silicon layer 218 to form a narrow shallow trench isolation feature 230 and a wide shallow trench isolation feature 231 in silicon layer 218. During this etching process, the plasma tends to anisotropically etch shallow trench isolation features 230 and 231. Typically, a profile angle between about 75 degrees and 89 degrees is formed. The etch profile is measured as an angle formed by the etch side wall with a plane parallel to the top surface of the silicon layer. The plasma also tends to erode away some of photoresist layer 210.

As discussed, top rounded attributes 226 are kept intact by the passivating film 228 during the this silicon etching process. The resultant trench features, after removal of the passivating film, are silicon trench features with top rounding starting at about the pad oxide/silicon interface. Additionally, because the depth of the top portion of the wide and narrow features (FIG. 3C) before the silicon etch are substantially the same, depth uniformity is better achieved between the narrow features and wide features. As shown, the difference 232 between the narrow and wide features is relatively insignificant.

In one exemplary application of this invention, a 200 mm substrate having thereon a silicon layer (e.g., monocrystalline or polycrystalline), a pad oxide layer (e.g., $SiO_2$), and a nitride layer (e.g., $Si_3N_4$), is etched in the aforementioned TCP™ 9400 plasma processing system. The pad oxide has a thickness on the order of 80 to 150 angstroms. The nitride layer has a thickness on the order of 1000 to 1800 angstroms. The thickness of the photoresist layer is typically between about 6,000 to 8,000 angstroms. The smallest trench has a feature size of 0.18 $\mu$m and the largest trench has a feature size of greater than 2.0 $\mu$pm. However, it should be noted that this invention is not limited to a particular sized substrate, a particular feature size or a particular plasma processing system.

In this application, the nitride layer is etched using an etch process that employs the $CF_4$/HBr-based chemistry. The pressure within the aforementioned plasma processing reactor system is preferably maintained from about 5 milliTorr (mT) to about 50 mT, and preferably at about 10 mT during nitride etching. The top RF power is preferably maintained from about 200 watts (W) to about 800 W, and preferably at about 600 W. The bottom electrode power is preferably maintained from about 40 watts (W) to about 300 W, and preferably at about 120 W.

The flow rate of $CF_4$ is preferably from about 20 standard cubic centimeters per minute (sccm) to about 200 sccm, and preferably at about 100 sccm during nitride etching. Preferably, the flow rate of $CF_4$ is between about 50% to 80% of the total flow. The flow rate of HBr is preferably from about 0 standard cubic centimeters per minute (sccm) to about 100 sccm, and preferably at about 50 sccm during etching. The ratio of the HBr flow rate to the $CF_4$ flow rate is preferably from about 0% to 75% and preferably at about 50%. It should be noted that the above chemistry may include $CHF_3$. The flow rate of $CHF_3$ may be as little as 0 standard cubic centimeters per minute (sccm) to about 100 sccm or about 0% to about 100% of the $CF_4$ flow. Furthermore, the etch source gas described above may also include a diluent gas, such as Argon.

The pad oxide is etched using an etch process that employs the $CHF_3$/$CF_4$ based chemistry. It should be noted that $CH_2F_2$ may be used with a similar etch recipe as $CHF_3$, although with differing shallow trench isolation feature results. Both chemistries provide good selectivity to silicon—$CHF_3$ is at about 2 to 1 and $CH_2F_2$ is about 10 to 1. Generally, a higher silicon selectivity offers better depth uniformity between feature sizes. $CH_2F_2$ tends to form a more contoured top rounded feature, typically, because it is more selective to silicon and therefore the vertical component of the etch is less and the $CH_2F_2$ also tends to deposit more polymer.

The pressure within the aforementioned plasma processing reactor system is preferably maintained from about 5 milliTorr (mT) to about 70 mT, and preferably at about 30 mT during pad oxide etching. The top RF power is preferably maintained from about 200 watts (W) to about 800 W, and preferably at about 600 W. The bottom electrode power is preferably maintained from about 50 watts (W) to about 300 W, and preferably at about 200 W.

The flow rate of $CF_4$ is preferably from about 10 standard cubic centimeters per minute (sccm) to about 70 sccm, and preferably at about 25 sccm during pad oxide etching. Preferably, the flow rate of $CF_4$ is between about 15% to 50% of the total flow. The flow rate of $CHF_3$ is preferably from about 20 standard cubic centimeters per minute (sccm) to about 120 sccm, and preferably at about 100 sccm during etching. The ratio of the $CHF_3$ flow rate to the $CF_4$ flow rate is preferably from about 100% to 500% and preferably at about 350%. It should be noted that the above chemistry may include $O_2$. The flow rate of $O_2$ may be as little as 0 standard cubic centimeters per minute (sccm) to about 10 sccm, or about 0% to about 50% of the $CF_4$ flow. Furthermore, the etch source gas described above may also include a diluent gas, such as Argon or Helium (e.g., 0–300 sccm or 0% to about 1000% of the $CF_4$ flow). To facilitate the formation of an effective top-rounded feature and/or to sufficiently balance the etch depths in the silicon layer, the pad oxide etch is preferably continued for at least 5 seconds after the pad oxide layer is etched through and more preferably at least 15 seconds. The termination of the pad oxide etch may be performed using any endpoint or time etch technique.

The silicon layer is etched, in this example, using an etch process that employs the $Cl_2/O_2/HBr$-based chemistry. The pressure within the aforementioned plasma processing reactor system is preferably maintained from about 5 milliTorr (mT) to about 30 mT, and preferably at about 10 mT during silicon etching. The top RF power is preferably maintained from about 250 watts (W) to about 800 W, and preferably at about 450 W during silicon etching. The bottom electrode power is preferably maintained from about 80 watts (W) to about 300 W, and preferably at about 120 W during silicon etching.

The flow rate of $Cl_2$ is preferably from about 20 standard cubic centimeters per minute (sccm) to about 70 sccm, and preferably at about 35 sccm during etching. Preferably, the flow rate of $Cl_2$ is between about 10% to 40% of the total flow. The flow rate of $O_2$ is preferably from about 2 standard cubic centimeters per minute (sccm) to about 12 sccm, and preferably at about 8 sccm during etching. The ratio of the $O_2$ flow rate to the $Cl_2$ flow rate is preferably from about 10% to 30% and preferably at about 20%. The flow rate of HBr is preferably from about 100 standard cubic centimeters per minute (sccm) to about 200 sccm, and preferably at about 150 sccm during etching. The ratio of the HBr flow rate to the $Cl_2$ flow rate is preferably from about 130% to 600% and preferably at about 400%. Furthermore, the etch source gas described above may also include a diluent gas, such as Argon.

It should be noted, however, that the flow rates of the component source gases may be scaled as needed when smaller or larger substrates are involved. Thus, while the relative flow rate among the various component gases (which may be expressed as a percentage of the $CF_4$ flow rate, for example) is important, the absolute flow rate for each component gas may be modified as needed to accommodate different substrate sizes.

In another embodiment, an alternate process flow would be to etch the nitride layer in a separate chamber, stopping at about the pad oxide layer or shortly thereafter. The pad oxide could then be etched in situ with the trench etch in another chamber, using the above mentioned chemistries. Alternatively, the nitride layer and the pad oxide layer may be etched together in situ, with the bulk silicon etch being performed in a separate chamber.

As can be seen from the foregoing, the present invention offers numerous advantages over the prior art. By way of example, the invention substantially eliminates sharp corners at the shoulder of a shallow trench isolation feature. The invention forms a top rounded feature that is located at about the interface between the pad oxide and silicon. Correspondingly, the top rounded feature reduces the possibilities of gate leakage at the shallow trench isolation features in the semiconductor device.

Further, the inventive technique improves substrate throughput by not requiring any additional process steps to produce the trench feature. By way of example, it is now possible to form the top rounded attribute during the hard mask etch step. Furthermore, the invention eliminates the need for oxidation steps that are usually required to overcome the gate leakage problem, which is caused by sharp corners. Still further, the invention allows an in situ approach to achieving top rounding of the silicon trench. For example, the hard mask etch, the forming of the top rounded attribute and the silicon etch can be done in the same chamber. Correspondingly, the "in situ" approach reduces handling and additional processing steps and machines that may add to the time and cost of making a semiconductor device.

Additionally, a protective passivating film is formed around the top rounded attribute. In this manner, the passivating film acts as a mask that protects the top rounded attribute during the subsequent silicon etching. Furthermore, the invention reduces the depth difference that is usually encountered between narrow and wide features during shallow trench isolation etching. By way of example, the invention is capable of providing a depth difference between about 2% to about 5% or even lower.

While this invention has been described in terms of several preferred embodiments, there are alterations, permutations, and equivalents which fall within the scope of this invention. By way of example, although the etch steps are performed in situ in accordance to a preferred embodiment, they may be performed in different processing chambers if desired. Also, a BARC (bottom anti reflective coating) layer may be disposed between the nitride layer and the photoresist layer, for photolithography purposes. Typically, a BARC layer helps the transfer of critical dimensions of the photoresist onto the nitride (e.g., patterning). It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. In a plasma processing chamber, a method of etching a trench in a silicon layer, said silicon layer being disposed below an oxide layer, said oxide layer being disposed below a nitride layer, said nitride layer being disposed below a photoresist mask, said method comprising:

flowing a first etchant source gas into said plasma processing chamber;

forming a first plasma from said first etchant source gas;

etching substantially through said nitride layer with said first plasma;

evacuating said first etchant source gas from said plasma processing chamber;

thereafter flowing a second etchant source gas into said plasma processing chamber;

forming a second plasma from said second etchant source gas; and etching through said oxide layer and a portion of said silicon layer with said second plasma, wherein said etching with said second plasma is extended for a period of time after said pad oxide layer is etched through, said period of time being sufficiently long to form an effective top-rounded feature on a portion of said trench.

2. The method of claim 1 wherein said method further includes:

flowing a third etchant source gas into said plasma processing chamber;

forming a third plasma from said third etchant source gas; and etching through said silicon layer with said third plasma, wherein said etching with said third plasma forms said trench.

3. The method of claim 2 wherein said third etchant source gas consists essentially of Cl2, O2 and HBr.

4. The method of claim 1 wherein said first etchant source gas includes a fluorocarbon.

5. The method of claim 4 wherein said first etchant source gas includes $CF_4$.

6. The method of claim 5 wherein said first etchant source gas further includes HBr.

7. The method of claim 1 wherein said second etchant source gas is substantially selective to silicon.

8. The method of claim 7 wherein said second etchant source gas includes a fluorocarbon.

9. The method of claim 7 wherein said second etchant source gas includes a hydro-fluorocarbon.

10. The method of claim 9 wherein said second etchant source gas includes $CHF_3$.

11. The method of claim 9 wherein said second etchant source gas includes $CH_2F_2$.

12. The method of claim 1 wherein said plasma processing chamber is an inductively-coupled plasma processing chamber.

13. The method of claim 1 wherein said plasma processing chamber is a capacitively-coupled plasma processing chamber.

14. The method of claim 1 wherein said plasma processing chamber is a wave excited plasma processing chamber.

15. The method of claim 1 wherein a BARC layer is disposed between said nitride layer and said photoresist mask.

16. The method of claim 1 wherein said period of time is also sufficiently long to effectively balance etch depths in narrow and wide areas in said silicon layer.

17. The method of claim 1 wherein said etching is also configured to form a passivating film adjacent to said top rounded attribute during said etching such that said passivating film substantially protects said top-rounded attribute from subsequent etching processes.

18. In a plasma processing chamber, a method of etching a trench in an underlying layer, said underlying layer being disposed underneath a hard mask layer, said method comprising:

flowing a hard mask etchant source gas into said plasma processing chamber;

forming a hard mask plasma from said hard mask etchant source gas, said hard mask plasma having a selectivity that makes it substantially selective to said underlying layer;

etching through said hard mask layer and a portion of said underlying layer with said hard mask plasma to form a narrow and wide trench in said underlying layer, said narrow and wide trench having shoulders, said narrow trench having a first etch depth, said wide trench having a second etch depth, said etching being configured to form an effective top-rounded attribute at said shoulders of said narrow and wide trench and to balance said first and second etch depths of said narrow and wide trench.

19. The method of claim 18 wherein the first etchant source gas comprises at least a first fluorocarbon gas, and wherein the second etchant source gas comprises at least a second fluorocarbon gas that is different than said first fluorocarbon gas.

20. The method of claim 18 wherein the first etchant source gas comprises at least one of $CF_4$, $C_2F_6$ or $CHF_3$, wherein the second etchant source gas comprises at least one of $CHF_3$, $CH_2F_2$, $CH_3F$, $CH_4$, $C_4F_8$, $C_2F_6$, $C_2HF_5$, and wherein the third etchant source gas comprises at least $Cl_2$.

21. In a single plasma processing chamber, a method of etching a trench in a layer stack comprising a nitride layer, an oxide layer and a silicon layer, said nitride layer covering said oxide layer and said oxide layer covering said silicon layer, said method comprising:

flowing a first etchant source gas into said single plasma processing chamber;

forming a first plasma from said first etchant source gas;

etching substantially through said nitride layer with said first plasma;

evacuating the first etchant source gas from said single plasma processing chamber;

flowing a second etchant source gas into said single plasma processing chamber, said second etchant source gas having a different composition than said first etchant source gas;

forming a second plasma from said second etchant source gas, said plasma being substantially selective to silicon;

etching through said oxide layer and a portion of said silicon layer with said second plasma, wherein said etching is extended for a period of time after said oxide layer is etched through, said period of time being sufficiently long to form an effective top-rounded attribute at a shoulder of said silicon layer, said etching also being configured to form a passivating film adjacent to said top rounded attribute during said etching such that said passivating film substantially protects said top-rounded attribute from subsequent etching process;

evacuating the second etchant source gas from said single plasma processing chamber;

flowing a third etchant source gas into said single plasma processing chamber, said third etchant source gas having a different composition than said first and second etchant source gases;

forming a third plasma from said third etchant source gas;

etching through said silicon layer with said third plasma to complete the formation said trench without removing the previously formed top-rounded attribute at the shoulder of said silicon layer.

22. The method of claim 21 wherein said period of time is also sufficiently long to effectively balance etch depths in narrow and wide areas in said silicon layer.

23. The method of claim 18 wherein said method further includes:

flowing an underlying layer etchant source gas into said plasma processing chamber, said underlying layer etchant source gas being suitable for etching the underlying layer;

forming an underlying layer plasma from said underlying layer etchant source gas; and etching through said underlying layer with said underlying layer plasma, wherein said etching forms said trench without damaging said top rounded attribute.

24. A method of etching a trench in an underlying layer, said underlying layer being disposed underneath a hard mask layer, said method comprising:

performing a first etch step, said first etch step comprising etching a first portion of said hard mask layer with a first etchant;

performing a second etch step, said second etch step comprising etching a second portion of said hard mask layer and a first portion of the underlying layer with a second etchant that is different than the first etchant, wherein said second etch step effectively rounds the top corners of said trench.

25. The method as recited in claim 24 wherein the first etchant employs a first fluorocarbon gas, and wherein the second etchant employs a second fluorocarbon gas that is different than the first fluorocarbon gas.

26. The method as recited in claim 24 further comprising performing a third etch step, said third etch step comprising etching a second portion of the underlying layer with a third etchant that is different than the first and second etchants, wherein said third etch step effectively forms the trench in said underlying layer without damaging the rounded top corners of said trench.

27. The method as recited in claim 26 wherein the first etchant employs a $CF_4$/HBr-based chemistry, wherein the second etchant employs a $CHF_3$/$CF_4$-based chemistry or a $CH_2F_2$/$CF_4$-based chemistry, and wherein the third etchant employs a $Cl_2$/$O_2$/HBr-based chemistry.

28. The method of claim 26 wherein all the steps are implemented in the same plasma processing chamber.

* * * * *